US009698765B1

(12) United States Patent
La Rosa et al.

(10) Patent No.: US 9,698,765 B1
(45) Date of Patent: Jul. 4, 2017

(54) DYNAMIC SENSE AMPLIFIER WITH OFFSET COMPENSATION

(71) Applicants: STMicroelectronics (Rousset) SAS, Rousset (FR); STMicroelectronics S.r.l., Agrate Brianza (IT)

(72) Inventors: Francesco La Rosa, Rousset (IT); Antonino Conte, Tremestieri Etneo (IT)

(73) Assignees: STMicroelectronics S.r.l., Agrate Brianza (MB) (IT); STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/049,944

(22) Filed: Feb. 22, 2016

(51) Int. Cl.
    G11C 11/22      (2006.01)
    G11C 11/00      (2006.01)
    H03K 5/003      (2006.01)
    H03K 17/687     (2006.01)
    G11C 7/06       (2006.01)
    G11C 7/12       (2006.01)

(52) U.S. Cl.
    CPC .............. H03K 5/003 (2013.01); G11C 7/06 (2013.01); G11C 7/12 (2013.01); H03K 17/687 (2013.01)

(58) Field of Classification Search
    USPC ..... 327/108–112, 379, 389, 391; 326/22–27, 326/81–87
    See application file for complete search history.

(56) References Cited

U.S. PATENT DOCUMENTS

| 4,973,864 | A  | * | 11/1990 | Nogami | G11C 7/062 327/208 |
| 5,796,651 | A  | * | 8/1998  | Horne   | G11C 11/418 365/154 |
| 7,633,809 | B2 | * | 12/2009 | Kajiyama | G11C 7/065 365/185.24 |
| 2003/0185076 | A1 | * | 10/2003 | Worley | G11C 7/065 365/207 |
| 2006/0023531 | A1 | * | 2/2006 | Crippa | G11C 11/5642 365/203 |
| 2006/0044903 | A1 | * | 3/2006 | Forbes | G11C 11/4091 365/205 |
| 2010/0097839 | A1 | * | 4/2010 | Kim | G11C 11/22 365/145 |
| 2012/0044779 | A1 | * | 2/2012 | Chuang | G11C 11/412 365/226 |

(Continued)

Primary Examiner — Brandon S Cole
(74) Attorney, Agent, or Firm — Gardere Wynne Sewell LLP

(57) ABSTRACT

A device includes a first and second inverters each having a signal input, signal output, high voltage supply terminal, and low voltage supply terminal. The signal input of the first inverter is coupled to the signal output of the second inverter, and the signal input of the second inverter is coupled to the signal output of the first inverter. A first transistor has a first conduction terminal coupled to a power supply node, a second conduction terminal coupled to the high voltage supply terminal of the first inverter, and a control terminal coupled to a first node. A second transistor has a first conduction terminal coupled to the power supply node, a second conduction terminal coupled to the high voltage supply terminal of the second inverter, and a control terminal coupled to a second node. First and second bit lines are capacitively coupled to the first and second nodes.

22 Claims, 4 Drawing Sheets

(56) References Cited

U.S. PATENT DOCUMENTS

2012/0106225 A1\* 5/2012 Deng ................. G06F 17/5068
  365/51
2015/0194209 A1\* 7/2015 Wu .................... G11C 11/1673
  365/148

\* cited by examiner

DYNAMIC SENSE AMPLIFIER WITH OFFSET COMPENSATION

TECHNICAL FIELD

This disclosure relates to the field of memory circuits, and, more particularly, to a dynamic sense amplifier for a circuit that is capable of compensating for a voltage offset.

BACKGROUND

A variety of electronic devices are in wide use today, such as laptop computers, smartphones, and tablets. Such electronic devices typically include a microprocessor, volatile storage for use by the microprocessor as it executes application software, and non-volatile storage for storing applications and data on a long term basis.

Sense amplifiers are used in such non-volatile or volatile memory devices to allow for reduced voltage swing on the bit lines thereof. Cross-coupled sense amplifiers are among various sense amplifier configurations used in non-volatile memory circuits. A known cross-coupled sense amplifier includes a pair of inverters "cross coupled" between a pair of bit lines. Each inverter has its input connected to one bit line and its output connected to the other bit line. A cross-coupled sense amplifier provides for fast signal amplification. However, in practice it is difficult to provide the pair of inverters with perfectly matched transistors. Mismatches in transistor characteristics may produce, for example, an offset voltage across the outputs of the inverters during the reset. This offset is reflected to the inputs of the inverters. In a particularly unfortunate scenario, this reflected offset can be detected as a signal representing a data bit, and a data error results. Such data errors are highly undesirable as they may negatively affect performance of the electronic device.

Therefore, there is a need for the development of a new sense amplifier which reduced sensitivity to the mismatches in transistor characteristics and offsets yet maintains the fast response of cross-coupled sense amplifiers.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

One aspect is directed to an electronic circuit having first and second inverters in a cross coupled arrangement, and compensation circuitry configured to control supply of the first and second inverters as functions of first and second bit line signals, respectively.

A further aspect is directed to an electronic circuit having first and second inverters in a cross coupled arrangement, each with first and second supply terminals. A first set of first and second supply components is coupled to the first and second supply terminals of the first inverter. A second set of first and second supply components is coupled to the first and second supply terminals of the second inverter. A first bit line is capacitively coupled to a first node between the first supply component of the first set and the first supply terminal of the first inverter. A second bit line is capacitively coupled to a second node between the first supply component of the second set and the first supply terminal of the second inverter. A first switch is coupled between an input and an output of the first inverter, and a second switch coupled between an input and an output of the second inverter.

Another aspect is directed to an electronic circuit having a first inverter with a signal input, a signal output, a high voltage supply terminal, and a low voltage supply terminal. A second inverter has a signal input, a signal output, a high voltage supply terminal, and a low voltage supply terminal. The signal input of the first inverter is coupled to the signal output of the second inverter, and the signal input of the second inverter is coupled to the signal output of the first inverter. A first transistor has a first conduction terminal coupled to a power supply node, a second conduction terminal coupled to the high voltage supply terminal of the first inverter, and a control terminal coupled to a first node. A second transistor has a first conduction terminal coupled to the power supply node, a second conduction terminal coupled to the high voltage supply terminal of the second inverter, and a control terminal coupled to a second node. A first bit line is capacitively coupled to the first node, and a second bit line capacitively coupled to the second node.

Yet another aspect is directed to an electronic circuit having a first inverter with a signal input, a signal output, a high voltage supply terminal, and a low voltage supply terminal. A second inverter has a signal input, a signal output, a high voltage supply terminal, and a low voltage supply terminal. The signal input of the first inverter is coupled to the signal output of the second inverter, and the signal input of the second inverter is coupled to the signal output of the first inverter. A first transistor has a first conduction terminal coupled to the low voltage supply terminal of the first inverter, a second conduction terminal coupled to a reference node, and a control terminal coupled to a first node. A second transistor has a first conduction terminal coupled to the low voltage supply terminal of the second inverter, a second conduction terminal coupled to the reference node, and a control terminal coupled to a second node. A first bit line is capacitively coupled to the first node, and a second bit line is capacitively coupled to the second node.

DETAILED DESCRIPTION

In the following description, numerous details are set forth to provide an understanding of the present disclosure. It will be understood by those skilled in the art, however, that the embodiments of the present disclosure may be practiced without these details and that numerous variations or modifications from the described embodiments may be possible.

Figure 1:
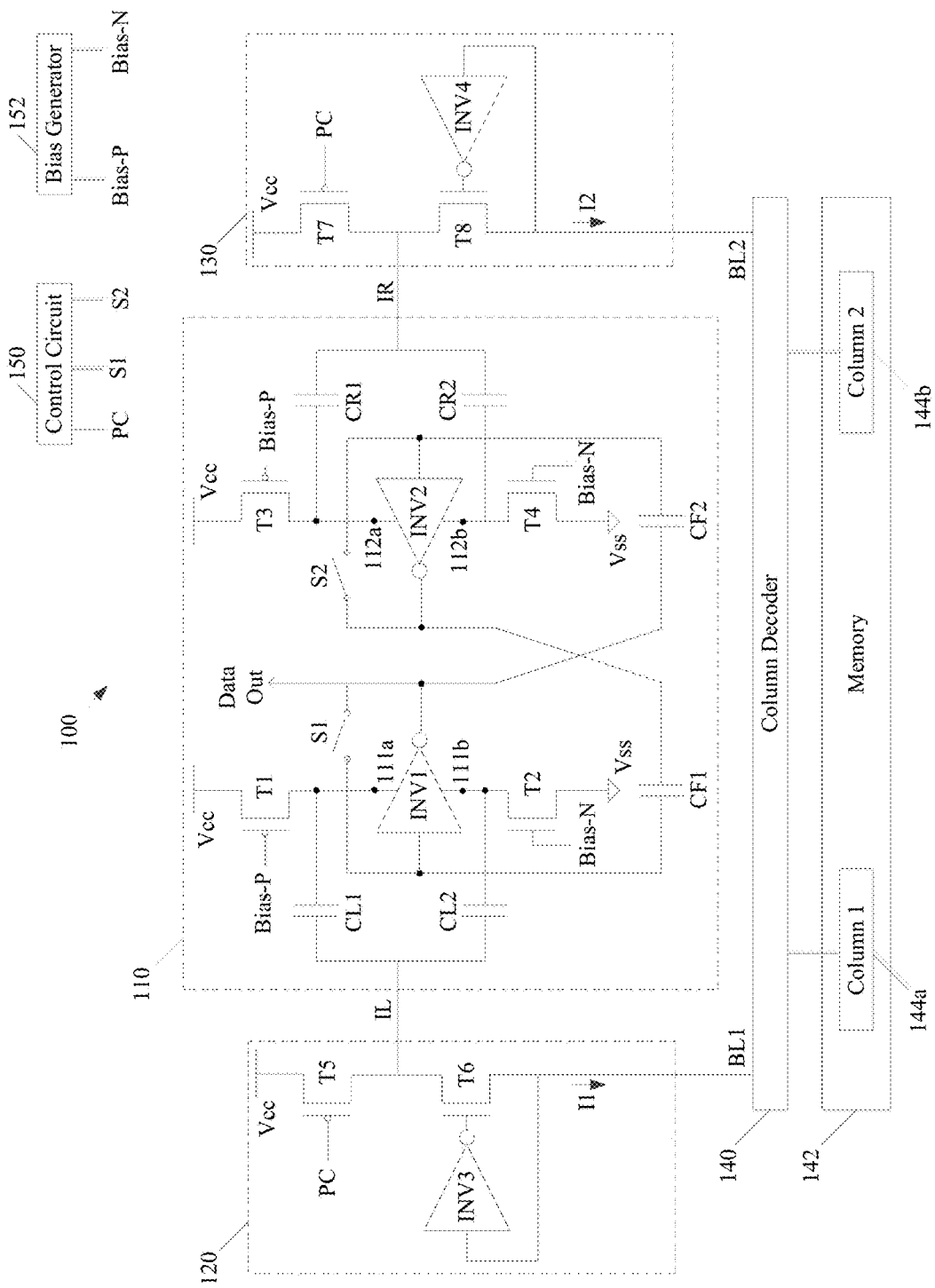
FIG. 1 is a schematic diagram of a sense amplifier in accordance with this disclosure.

With initial reference to FIG. 1, a sense amplifier circuit 100 is now described. The sense amplifier circuit 100 is comprised of a sense amplifier core 110 having a pair of differential inputs coupled to receive a first bit line signal IL and a second bit line signal IR from a first precharge circuit 120 and a second precharge circuit 130 respectively. The precharge circuits 120, 130 will now briefly be described before the sense amplifier core 110 is described.

The first precharge circuit 120 includes a PMOS transistor T5 and an NMOS transistor T6 in a drain-drain coupled arrangement between a power supply node Vcc and a first bit line BL1. The gate of the transistor T5 is controlled by a precharge control signal PC. An inverter INV3 receives input from the source of the NMOS transistor T6 and provides output to the gate thereof. The first bit line signal IL is tapped from a node between the PMOS transistor T5 and the NMOS transistor T6.

The second precharge circuit 130 includes a PMOS transistor T7 and a NMOS transistor T8 in a drain drain coupled arrangement between a power supply node Vcc and a second bit line BL2. The gate of the transistor T7 is controlled by the precharge control signal PC. An inverter INV4 receives input from the source of the NMOS transistor T8 and provides output to the gate thereof. The first bit line signal IR is tapped from a node between the PMOS transistor T7 and the NMOS transistor T8.

A memory 142 has multiple columns including a first column 144a and a second column 144b. A column decoder 140 is coupled to the first and second columns 144a, 144bb, and respectively outputs to the first bit line signal BL1 and the second bit line signal BL2.

The sense amplifier core 110 will now be described. The sense amplifier core 110 includes a first inverter INV1 and a second inverter INV2 in a cross coupled arrangement.

The first inverter INV1 has a first supply terminal 111a (i.e. the source terminal of the inverter's PMOS transistor) coupled to a drain of PMOS transistor T1, which has its source coupled to the supply node Vcc and its gate coupled to a biasing signal Bias-P. The first inverter INV1 also has a second supply terminal 111b (i.e. the source terminal of the inverter's NMOS transistor) coupled to a drain of a transistor T2, which has its gate coupled to a biasing signal Bias-N and its source coupled to the reference node Vss. A pair of capacitors CL1, CL2 capacitively couple the first bit line signal IL to the first and second supply terminals 111a, 111b of the first inverter INV1, and serve to block DC components of the first bit line signal IL. A switch S1 is coupled between an input and an output of the first inverter INV1.

The second inverter INV2 has a first supply terminal 112a (i.e. the source terminal of the inverter's PMOS transistor) coupled to a drain of PMOS transistor T3, which has its gate coupled to the biasing signal Bias-P and its source coupled to the supply node Vcc. The second inverter INV2 also has a second supply terminal 112b (i.e. the source terminal of the inverter's NMOS transistor) coupled to a drain of a transistor T4, which has its gate coupled to the biasing signal Bias-N and its source coupled to the reference node Vss. A pair of capacitors CR1, CR2 capacitively couple the second bit line signal IR to the first and second supply terminals 112a, 112b of the second inverter INV2, and serve to block DC components of the second bit line signal IR. A switch S2 is coupled between an input and an output of the second inverter INV2.

The output of the first inverter INV1 is coupled to the input of the second inverter INV2 through a filtering capacitor CF2, and the output of the second inverter INV2 is coupled to the input of the first inverter INV1 through a filtering capacitor CF1.

A control circuit 150 generates the precharge control signal PC, as well as control signals S1, S2 for the switches S1, S2. A bias generator 152 generates the biasing signals Bias-P, Bias-N.

In operation, in the memory 142, first and second bit lines BL1, BL2 are selected simultaneously, but only one word line is selected. The first and second bit lines BL1, BL2 respectively read out the columns 144a, 144b, but, for example only column 144a has its word line selected. Thus, the second bit line BL2 does not represent data, but instead provides a capacitive load to balance the sense amplifier 100. In other applications, the first bit line BL1 provides the capacitive load while the second bit line BL2 provides the data from the selected word line.

When the precharge circuits 120, 130 are activated by the precharge control signal PC to be in a precharge phase, the PMOS transistors T1 and T3 are therefore on. An equilibrium is reached such that the first and second bit lines BL1, BL1, at the sources of transistors T6, T8 are at approximately the transition point of the inverters INV1, INV2. While the PMOS transistors T1, T3 are on, the drain of the NMOS transistors T2, T4 is kept at Vcc by the PMOS transistors T1, T3. When the precharge control signal PC flips, the drains of the NMOS transistors T2, T4 drop linearly, driven by the current sunk from the supply terminals 111a, 111b and 112a, 112b of the inverters INV1, INV2. Since the word line coupled to BL1 is activated while the word line coupled to BL2 is not activated, the currents I1 and I2 will differ. Depending on which of I1 and I2 is larger, one of the signals IL or IR will decay at a quicker rate than the other.

The sense amplifier core 110 serves to detect the difference between the slopes of the signals IL and IR. The switches S1 and S2 are closed during the precharge phase. The precharge phase is ended via transitioning of the precharge control signal PC to turn off the transistors T5 and T7. Thereafter, the sense amplifier 100 enters into the sensing phase.

In the sensing phase, the switches S1 and S2 are opened once the first and second bit line signals IL and IR respectively drop below a given threshold point. When in the sensing phase, the sense amplifier core 110 responds like a metastable latch. As the first bit line signal IL and second bit line signal IR decay over time, the threshold at which the inverters INV1 and INV2 distinguish a logic low from a logic high is adjusted. Therefore, the values ultimately output by the inverters INV1 and INV2 are dependent on the differential signal transferred to the supply terminals of the inverters INV1 and INV2 by the first bit line signal IL and the second bit line signal IR. A sample graphs of IL and IR over time, for one sample memory value, is shown in FIG. 4.

Figure 4:
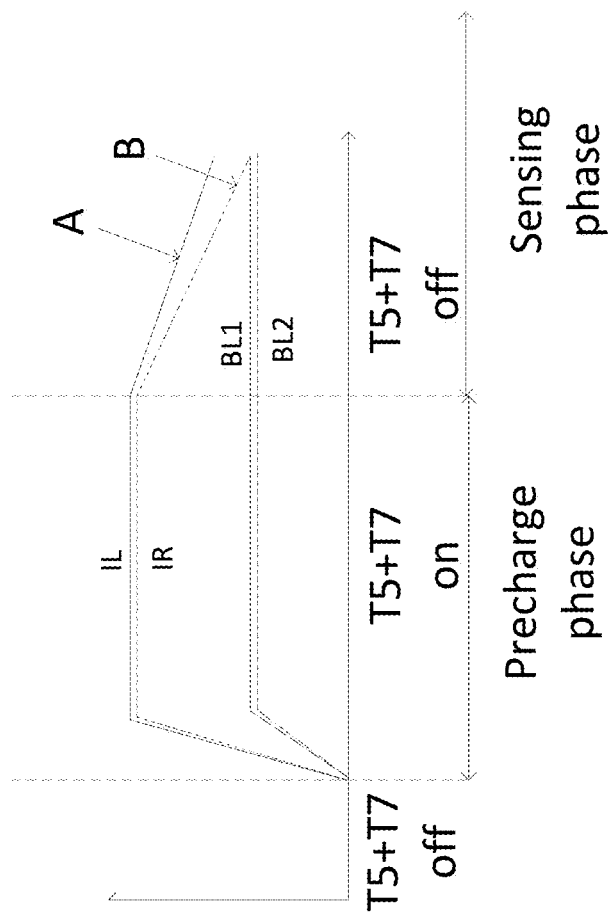
FIG. 4 is a graph showing the precharging of the first and second bit line signals together with their decay over time.

In the sample graph shown in FIG. 4, the second bit line signal IR (labeled as B) decays at a greater rate over time in comparison to the first bit line signal IL (labeled as A). The second bit line signal IR is transferred through the capacitors CR1 and CR2 to nodes 112a and 112b respectively. The decay of the second bit line signal IR pinches off the PMOS transistor of inverter INV2 while turning on the NMOS transistor of inverter INV2. If the second bit line signal IR decays at a quicker rate than the first bit line signal IL, the PMOS transistor of INV2 will be pinches off quicker than the PMOS transistor of inverter INV1, and the NMOS transistor of inverter INV2 will be turned on faster than the NMOS transistor of inverter INV1. This ultimately causes the output of inverter INV2 to be driven low quicker than the output of inverter INV1, resulting in a state where the output of INV2 is low while the output of INV1 is high.

Figure 3:
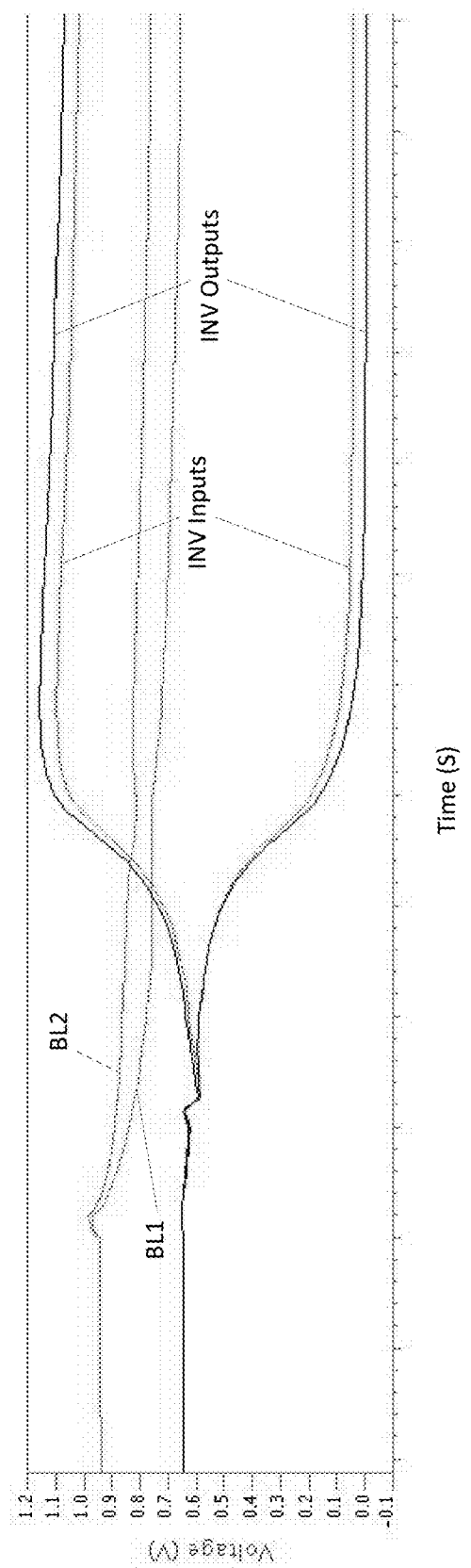
FIG. 3 is a graph showing the response of the sense amplifier of FIG. 1 in response to a large input signal.

Conversely, if the first bit line signal IL decays more sharply over time than the second bit line signal IR, the first inverter INV1 will ultimately output a logic high and the second inverter INV2 will output a logic low. The output of the sense amplifier 100 may be read from either the output of the inverter INV1 or the output of the inverter INV2. Shown in FIG. 3 is the response of the sense amplifier 100 in response to a large input signal.

Figure 2:
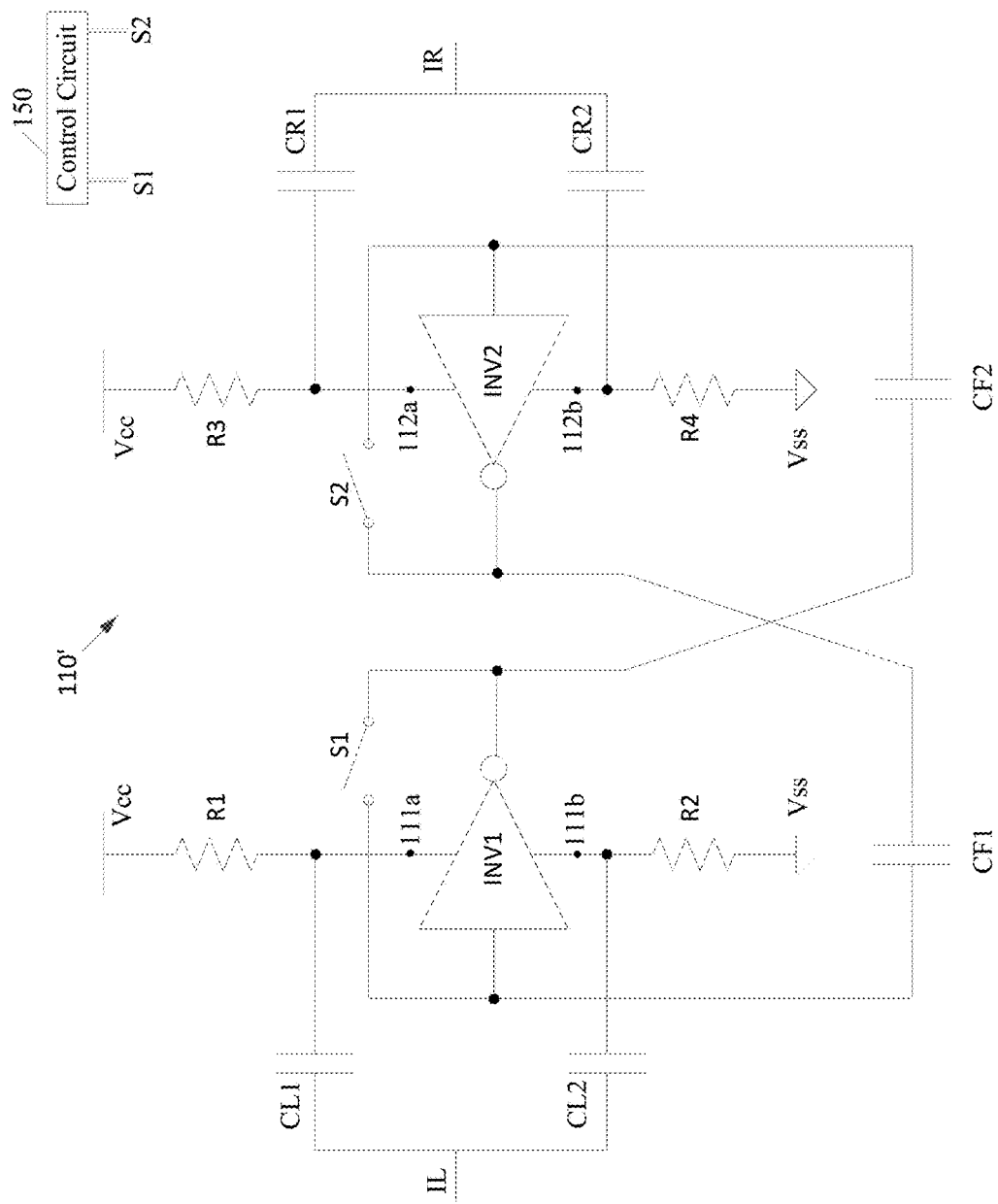
FIG. 2 is a schematic diagram of an alternative design of the sense amplifier core of FIG. 1 in accordance with this disclosure.

It should be understood that alternative implementations of the sense amplifier core 110 may be used. For example, in the implementation of the sense amplifier core 110' shown in FIG. 2, resistors R1-R4 are used in place of the transistors T1-T4.

The sense amplifier 100 described herein provides a variety of advantages. For example, the sense amplifier 100 switches more quickly than conventional sense amplifier switches 100 since there are no capacitances to be charged or discharged when the switches S1 and S2 are opened. This helps to reduce power consumption, and to allow the sense amplifier 100 to work with low voltages.

Although the preceding description has been described herein with reference to particular means, materials and embodiments, it is not intended to be limited to the particulars disclosed herein; rather, it extends to all functionally equivalent structures, methods, and uses, such as are within the scope of the appended claims.

The invention claimed is:

1. An electronic circuit, comprising:
   first and second inverters in a cross coupled arrangement; and
   compensation circuitry configured to control supply of the first and second inverters as a function of first and second bit line signals, respectively;
   wherein the compensation circuitry comprises:
      first and second capacitors respectively coupling the first bit line signal to a first supply terminal of the first inverter and a second supply terminal of the first inverter; and
      third and fourth capacitors respectively coupling the second bit line signal to a first supply terminal of the second inverter and to a second supply terminal of the second inverter.

2. The electronic device of claim 1, wherein the first supply terminal of the first inverter comprises a high voltage supply terminal; and wherein the first supply terminal of the second inverter comprises a high voltage supply terminal.

3. The electronic device of claim 2, wherein the high voltage supply terminal of the first inverter comprises a source node of a PMOS transistor of the first inverter; and wherein the high voltage supply terminal of the second inverter comprises a source node of a PMOS transistor of the second inverter.

4. The electronic device of claim 1, wherein the second supply terminal of the first inverter comprises a low voltage supply terminal; and wherein the second supply terminal of the second inverter comprises a low voltage supply terminal.

5. The electronic device of claim 4, wherein the low voltage supply terminal of the first inverter comprises a source node of an NMOS transistor of the first inverter; and wherein the low voltage supply terminal of the second inverter comprises a source node of an NMOS transistor of the second inverter.

6. The electronic circuit of claim 1, wherein the compensation circuitry also comprises:
   a first switch configured for shorting an input and an output of the first inverter when in precharge mode and decoupling the input and the output of the first inverter when in sense mode; and
   a second switch configured for shorting an input and an output of the second inverter when in precharge mode and decoupling the input and the output of the second inverter when in sense mode.

7. The electronic circuit of claim 1, further comprising first and second precharge circuits configured to precharge the first and second bit line signals.

8. The electronic circuit of claim 1, further comprising a first filtering capacitor coupled between an output of the second inverter and an input of the first inverter, and a second filtering capacitor coupled between an output of the first inverter and an input of the second inverter.

9. An electronic circuit, comprising:
   first and second inverters in a cross coupled arrangement and each having first and second supply terminals;
   a first set of first and second supply components coupled to the first and second supply terminals of the first inverter;
   a second set of first and second supply components coupled to the first and second supply terminals of the second inverter;
   a first bit line capacitively coupled to a first node between the first supply component of the first set and the first supply terminal of the first inverter, and capacitively coupled to a third node between the second supply component of the first set and the second supply terminal of the first inverter;
   a second bit line capacitively coupled to a second node between the first supply component of the second set and the first supply terminal of the second inverter;
   a first switch coupled between an input and an output of the first inverter; and
   a second switch coupled between an input and an output of the second inverter.

10. The electronic device of claim 9, wherein the second bit line is also capacitively coupled to a fourth node between the second supply component of the second set and the second supply terminal of the second inverter.

11. The electronic device of claim 9, wherein the first and second supply components of the first set thereof comprise resistors; and wherein the first and second supply components of the second set thereof comprise resistors.

12. The electronic device of claim 9, wherein the first and second supply components of the first set thereof comprise current sources; and wherein the first and second supply components of the second set thereof comprise current sources.

13. The electronic device of claim 9, wherein the first supply component of the first set thereof comprises a PMOS transistor having a source coupled to a supply voltage and a drain coupled to the first supply terminal of the first inverter at the first node; wherein the first supply component of the second set thereof comprises a PMOS transistor having a source coupled to a supply voltage and a drain coupled to the first supply terminal of the second inverter at the second node.

14. The electronic device of claim 10, wherein the second supply component of the first set thereof comprises a NMOS transistor having a source coupled to a reference voltage and a drain coupled to the second supply terminal of the first inverter at the third node; and wherein the second supply component of the second set thereof comprises a NMOS transistor having a source coupled to a reference voltage and a drain coupled to the second supply terminal of the second inverter at the fourth node.

15. The electronic device of claim 9, further comprising a first precharge circuit precharging and coupling the first bit line to the first and second supply terminals of the first inverter, and a second precharge circuit precharging and coupling the second bit line to the first and second supply terminals of the second inverter.

16. An electronic circuit, comprising:
   a first inverter having a signal input, a signal output, a high voltage supply terminal, and a low voltage supply terminal;
   a second inverter having a signal input, a signal output, a high voltage supply terminal, and a low voltage supply terminal;
   wherein the signal input of the first inverter is coupled to the signal output of the second inverter, and wherein the signal input of the second inverter is coupled to the signal output of the first inverter;
   a first transistor having a first conduction terminal coupled to a power supply node, and a second conduction terminal coupled to the high voltage supply terminal of the first inverter;
   a second transistor having a first conduction terminal coupled to the power supply node, and a second conduction terminal coupled to the high voltage supply terminal of the second inverter;
   a first bit line capacitively coupled to the high voltage supply terminal of the first inverter and to the low voltage supply terminal of the first inverter; and
   a second bit line capacitively coupled to the high voltage supply terminal of the second inverter and to the low voltage supply terminal of the second inverter.

17. The electronic device of claim 16, further comprising a first switch coupled between the signal input and the signal output of the first inverter.

18. The electronic device of claim 16, further comprising a second switch coupled between the signal input and the signal output of the second inverter.

19. An electronic circuit, comprising:
   a first inverter having a signal input, a signal output, a high voltage supply terminal, and a low voltage supply terminal;
   a second inverter having a signal input, a signal output, a high voltage supply terminal, and a low voltage supply terminal;
   wherein the signal input of the first inverter is coupled to the signal output of the second inverter, and wherein the signal input of the second inverter is coupled to the signal output of the first inverter;
   a first transistor having a first conduction terminal coupled to the low voltage supply terminal of the first inverter, and a second conduction terminal coupled to a reference node;
   a second transistor having a first conduction terminal coupled to the low voltage supply terminal of the second inverter, and a second conduction terminal coupled to the reference node;
   a first bit line capacitively coupled to the high voltage supply terminal of the first inverter and to the low voltage supply terminal of the first inverter; and
   a second bit line capacitively coupled to the high voltage supply terminal of the second inverter and to the low voltage supply terminal of the second inverter.

20. The electronic device of claim 19, further comprising a first switch coupled between the signal input and the signal output of the first inverter.

21. The electronic device of claim 19, further comprising a second switch coupled between the signal input and the signal output of the second inverter.

22. An electronic circuit, comprising:
   first and second inverters in a cross coupled arrangement; and
   compensation circuitry configured to control supply of the first and second inverters as a function of first and second bit line signals, respectively;
   wherein the compensation circuitry comprises:
   a first capacitor coupling the first bit line signal to a source node of a PMOS transistor of the first inverter;
   a second capacitor coupling the first bit line signal to a source node of an NMOS transistor of the first inverter;
   a third capacitor coupling the second bit line signal to a source node of a PMOS transistor of the second inverter; and
   a fourth capacitor coupling the second bit line signal to a source node of an NMOS transistor of the second inverter.

* * * * *